United States Patent [19]

Ishihara et al.

[11] Patent Number: 5,126,169
[45] Date of Patent: Jun. 30, 1992

[54] PROCESS FOR FORMING A DEPOSITED FILM FROM TWO MUTUALLY REACTIVE ACTIVE SPECIES

[75] Inventors: Shunichi Ishihara, Ebina; Hisanori Tsuda, Atsugi; Masahiro Kanai, Tokyo; Masafumi Sano, Atsugi, all of Japan

[73] Assignee: Canon Kabushiki Kaisha, Tokyo, Japan

[21] Appl. No.: 639,410

[22] Filed: Jan. 10, 1991

Related U.S. Application Data

[63] Continuation of Ser. No. 89,758. Aug. 27, 1987, abandoned.

[30] Foreign Application Priority Data

Aug. 28, 1986 [JP] Japan .................. 61-202007
Aug. 28, 1986 [JP] Japan .................. 61-202019

[51] Int. Cl.⁵ .............. C23C 16/00; B05D 3/06
[52] U.S. Cl. .............. 427/255.1; 427/255.2; 427/248.1; 427/42; 427/45.1
[58] Field of Search .............. 427/255.1, 255.2, 42, 427/45.1, 248.1; 437/5

[56] References Cited

U.S. PATENT DOCUMENTS

| | | | |
|---|---|---|---|
| 4,217,374 | 8/1980 | Ovshinsky et al. | 427/39 |
| 4,657,777 | 4/1987 | Hirooka | 427/39 |
| 4,689,093 | 8/1987 | Ishihara et al. | 427/255.1 |
| 4,702,934 | 10/1987 | Ishihara et al. | 427/39 |
| 4,716,048 | 12/1987 | Ishihara et al. | 427/39 |
| 4,717,586 | 1/1988 | Ishihara et al. | 427/39 |
| 4,726,963 | 2/1988 | Ishihara et al. | 427/39 |
| 4,728,528 | 3/1988 | Ishihara et al. | 427/39 |
| 4,759,947 | 7/1988 | Ishihara et al. | 427/38 |
| 4,778,692 | 10/1988 | Ishihara et al. | 427/53.1 |
| 4,784,874 | 11/1988 | Ishihara et al. | 427/49 |
| 4,801,468 | 1/1989 | Ishihara et al. | 427/35 |
| 4,803,093 | 2/1989 | Ishihara et al. | 427/35 |
| 4,818,560 | 4/1989 | Ishihara et al. | 427/38 |
| 4,818,563 | 4/1989 | Ishihara et al. | 427/55 |
| 4,853,251 | 8/1989 | Ishihara et al. | 427/38 |

FOREIGN PATENT DOCUMENTS 0074212 3/1983 European Pat. Off. .
60-41047 3/1985 Japan .
2148328 5/1985 United Kingdom ............ 427/255.1

*Primary Examiner*—Shrive Beck
*Assistant Examiner*—Roy V. King
*Attorney, Agent, or Firm*—Fitzpatrick, Cella, Harper & Scinto

[57] ABSTRACT

A process for forming a deposited film on a substrate which comprises introducing plural kinds of precursors formed in activation spaces (B), as starting materials for a deposited film and an active species formed in an activation space (C) which is to react with at least two kinds among said plural kinds of precursors respectively at different reaction rates into a deposition space (A) for forming a deposited film on a substrate, wherein the precursor having a property of reacting with said active species at a lower reaction rate is mixed with said active species at an upper stream position as compared with the precursor having a property of reacting with said active species at a higher reaction rate.

8 Claims, 4 Drawing Sheets

PROCESS FOR FORMING A DEPOSITED FILM FROM TWO MUTUALLY REACTIVE ACTIVE SPECIES

This application is a continuation of application Ser. No. 07/089,758 filed Aug. 27, 1987, now abandoned.

BACKGROUND OF THE INVENTION

1. Field of the Invention

This invention relates to a process and an apparatus suitable for forming a deposited film, above all a functional film, especially an amorphous or crystalline deposited film to be used for semiconductor devices, photoelectric energy transducers (solar battery, photosensitive drum, image sensor, etc.), or photovoltaic devices, etc.

2. Related Background Art

Usually, for formation of a silicon (Si) film at low temperature, various CVD methods such as the plasma CVD method, the optical CVD method, etc., the vacuum vapor deposition method, the reactive sputtering method, the ion plating method, etc. have been attempted, and, in general, the plasma CVD method has been widely used and industrialized.

Most of the deposited films obtained by the plasma CVD method are amorphous silicon (A-Si) films, and there is room left for further improvement of overall characteristics with respect to electrical, optical characteristics and fatique characteristics or uniformness, bulk productivity, etc. Also, according to the plasma CVD method, it is difficult to deposit a polysilicon film of good quality on a glass substrate.

The reaction process in formation of silicon deposited film according to the plasma CVD method generalized in the prior art is considerably complicated as compared with the CVD method of the prior art, and not a few ambiguities exist in its reaction mechanism. Also, there are involved a large number of parameters for formation of its deposited film (e.g. substrate temperature, flow rates and their ratios of gases introduced, pressure during film formation, high frequency power, electrode structure, structure of reaction vessel, gas discharging speed, plasma generation system, etc.), and the plasma formed by combination of such a large number of parameters may sometimes become unstable to frequently result in markedly bad influences on the deposited film formed. Besides, the parameters inherent in the devices must be chosen for each device, and it has been difficult under the present situation to generalize the production conditions.

As a substitute for the plasma CVD method in which many ambiguities are involved in the reaction mechanism, there has been proposed HR-CVD in which a plural number of gases are introduced into a film forming space, and also some of the gases are previously activated by an energy of light, heat, plasma, etc., thereby depositing a film on a substrate arranged in the film forming space (Japanese Laid-open Patent Publication No. 41047/1985).

According to such an invention, for example, when forming an amorphous silicon (A-Si) film, there is adopted a method in which $SiF_2$ gas which is a precursor and $H^*$ (hydrogen radical) which is an active species are permitted to be associated with each other to form A-Si on the substrate.

The particularly advantageous point of this method is that a variety of Si films ranging from a Si film containing microcrystalline phase which is one form of amorphous silicon to a polycrystalline Si(poleg-Si) can be prepared depending on the concentration of $H^*$.

In the conventional HR-CVD method, however, we often have been confronted with difficulties, in case of introducing into a deposition space a plurality of precursors depending on the number of elements constituting a film to be formed, in attaining a desired ratio of the elements incorporated into the film.

For example, as described above, it has been possible, as for independently, to associate $SiF_2$ gas as a precursor with $H^*$ as an active species to form an A-Si film on a substrate, or similarly to associate $GeF_n(n=1,2$ or $3)$ gas as a precursor with $H^*$ as an active species to form an A-Ge film, but formation of a diposited film containing Si atoms and Ge atoms at a ratio of 1:1 is not easily performed and a film rich in Si is formed inevitably. In order to improve this, some attempts of varying the introducing ratio of $SiF_2$, $GeF_2$ and $H^*$ gases have been practiced, but in most cases, a deposited film of desired composition could not be obtained.

Thus, although HR-CVD has various advantages over the conventional plasma CVD, there is still room for improvement particularly in case of forming deposition films constituted of plural kinds of elements.

SUMMARY OF THE INVENTION

An object of the present invention is to provide a process for forming a deposited film suitable for film enlargement which shows improvement in the productivity and bulk production of film, while attempting to improve various characteristics of the film formed, film forming speed and reproducibility and also to produce a film of uniform quality.

Particularly, it is intended to provide a process for forming deposited film which can give a deposited film with a desired composition having good reproducibility when the deposited film is to be formed from two or more kinds of precursors.

The present invention accomplishes the above object by providing a process for forming a deposited film on a substrate which comprises introducing plural kinds of precursors formed in activation spaces (B), as starting materials for a deposited film, and an active species formed in an activation space (C) and to react at least two kinds among said plural kinds of precursors respectively at different reaction rates in a deposition space (A) for forming a deposited film on a substrate, wherein the precursor having a property of reacting with said active species at lower reaction rate is mixed with said active species at an upper stream position as compared with the precursor having a property of reacting with said active species at a higher reaction rate.

The present invention also provides an apparatus for forming a deposited film on a substrate which comprises plural introducing pipes for introducing plural kinds of precursors into a deposition space and an introducing pipe for introducing an active species into the deposition space and is adapted to form a deposited film on a substrate placed in said deposition space utilizing said precursors as source materials, wherein the outlet of the introducing pipe for the precursor having a property of reacting with said active species at a lower reaction rate is situated at an upper stream position in said introducing pipe for an active species as compared with the outlet of the introducing pipe for the precursor having a property of reacting with said active species at a higher reaction rate.

DESCRIPTION OF THE PREFERRED EMBODIMENT

Figure 1:
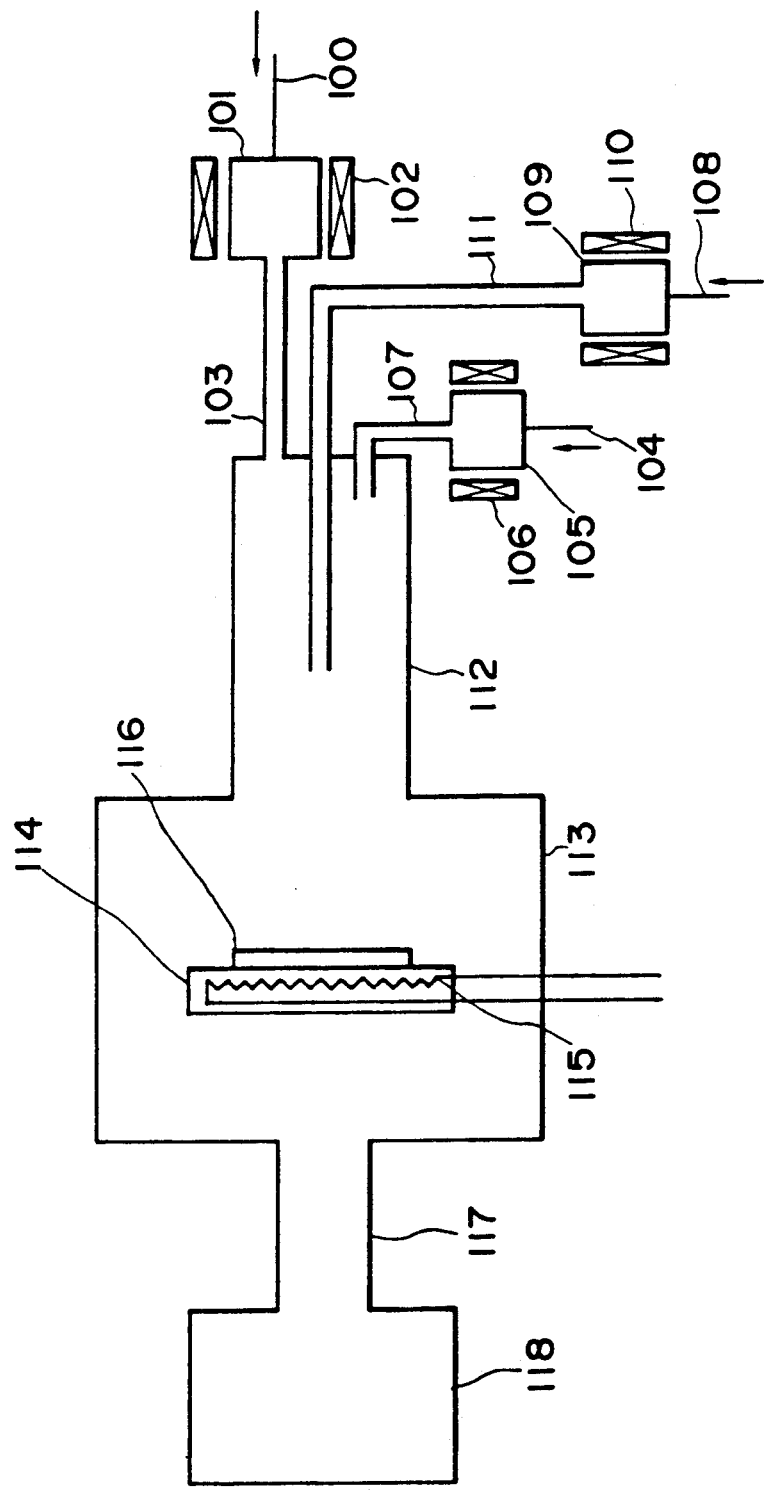
FIG. 1, FIG. 3, FIG. 4 and FIG. 5 are schematic illustrations showing examples of the apparatus for embodying the process for forming a deposited film of the present invention, respectively

The term "precursor" in the present invention refers to a material which can be the starting material of the deposited film formed, but it cannot entirely or substantially form a deposited film under the energy state as it is. The term "active species" refers to one undertaking the role of undergoing chemical mutual actions with the above precursors, thereby for example giving energy to the precursors or chemically reacting with the precursors to make the precursors under the state capable of forming a deposited film. Active species may contain elements for constituting a deposited film to be formed.

In the present invention, the precursors from the activation space (B) introduced into the deposition space (A) may be selected and used as desired from those having a life preferably 0.01 sec. or longer, more preferably 0.1 sec. or longer, and the constituent elements of the precursors will constitute the main components constituting the deposited film to be formed in the deposition space (A). On the other hand, the active species introduced from the activation space (C) undergo chemical mutual actions with the above precursors containing the constituent elements which are introduced from the activation space (B) into the deposition space (A) at the same time during formation of a deposited film in the deposition space (A) and become the main constituents of the deposited film to be formed. As a result, a desired deposited film is easily formed on a desired substrate.

According to the process of the present invention, the deposited film formed on the substrate surface in the deposition space (A) without formation of plasma is substantially free from the bad influence of etching action or other actions such as abnormal discharging action, etc. Also, according to the present invention, by controlling the atmosphere temperature, the substrate temperature in the deposition space (A) as desired, a more stable CVD process can be obtained.

In the present invention, the precursors formed in the activation spaces (B$_1$), (B$_2$) . . . and the active species formed in the activation space (C) are not only formed by energies of discharging, light, heat or combination thereof, but also may be formed by contact with or addition of catalysts, etc.

In the present invention, as the starting materials to be introduced into the activation spaces (B$_1$), (B$_2$) . . . , those having highly electron attractive atoms or atomic groups, or polar groups bonded to carbon atom or silicon atom or germanium atom may be utilized. Examples of such compounds may include:

$Y_nX_{2n-2}$ ($n = 1, 2, 3 \ldots$),
$X = F, Cl, Br, I,$
$Y = C, Si, Ge$.

$(YX_2)_n$ ($n \geq 3, X = F, Cl, Br, I,$
$Y = C, Si, Ge$).

$Y_nHX_{2n-1}$ ($n = 1, 2, 3 \ldots$),
$X = F, Cl, Br, I,$
$Y = C, Si, Ge$).

$Y_nH_2X_{2n}$ ($n = 1, 2, 3 \ldots$),
$X = F, Cl, Br, I,$
$Y = C, Si, Ge$).

More specifically, there may be included gaseous or readily gasifiable compounds such as $CF_4$, $(CF_2)_5$, $(CF_2)_6$, $(CF_2)_4$, $C_2F_6$, $C_3F_8$, $CHF_3$, $CH_2F_2$, $CCl_4$, $(CCl_2)_5$, $CBr_4$, $(CBr_2)_5$, $C_2Cl_6$, $C_2Br_6$, $CHCl_3$, $CHBr_3$, $CHI_3$, $C_2Cl_3F_3$; $SiF_4$, $(SiF_2)_5$, $(SiF_2)_6$, $(SiF_2)_4$, $Si_2F_6$, $Si_3F_8$, $SiHF_3$, $SiH_2F_2$, $SiCl_4$ $(SiCl_2)_5$, $SiBr_4$, $(SiBr_2)_5$, $Si_2Cl_6$, $Si_2Br_6$, $SiHCl_3$, $SiHBr_3$, $SiHI_3$, $Si_2Cl_3F_3$; $GeF_4$, $(GeF_2)_5$, $(GeF_2)_6$, $(GeF_2)_4$, $Ge_2F_6$, $Ge_3F_8$, $GeHF_3$, $GeH_2F_2$, $GeCl_4$, $(GeCl_2)_5$, $GeBr_4$, $(GeBr_2)_5$, $Ge_2Cl_6$, $Ge_2Br_6$, $GeHCl_3$, $GeHBr_3$, $GeHI_3$, $Ge_2Cl_3F_3$ and the like.

Also, $SiH_2(C_6H_5)_2$, $SiH_2(CN)_2$, etc., may be used depending on the purpose of use of the deposited film formed.

By giving decomposition energy of heat, light, discharging to the starting gases as described above in the activation chambers (B$_1$), (B$_2$) . . . , or alternatively through contact with catalysts, precursors are formed. These precursors are introduced into the deposition space (A). During this operation, the life of precursor is required to be desirably 0.01 sec. or longer for promoting elevation of deposition efficiency and deposition speed and increasing efficiency of the activation reaction with the active species introduced from the activation space (C) in the deposition space (A). At that time, if necessary, by giving discharging energy such as plasma within the range of not placing the substrate in plasma, or an energy of heat, light, etc. within the deposition space (A) or on the substrate, formation of a desired deposited film can be accomplished.

In the present invention, as the starting material for formation of an active species to be introduced into the activation space (C), there may be included $H_2$, $SiH_4$, $SiH_3F$, $SiH_3Cl$, $SIH_3Br$, $SiH_3I$, etc., and otherwise rare gases such as He, Ar or the like.

In the present invention, the ratio of the amount of the precursors introduced from the activation spaces (B$_1$), (B$_2$) . . . to the amount of the active species introduced from the activation space (C) in the deposition space (A) may be suitably determined as desired depending on the deposition conditions, the kind of the active species, but may be preferably 10:1 to 1:10 (introduced flow rate ratio), more preferably 8:2 to 4:6.

Depending of the degree of reaction rate of the respective precursors with the active species, the introduction positions of the two or more kinds of precursors introduced into the reaction space are determined, but it is desirable to determine the respective introduction positions also in view of the life of the respective precursors and active species.

The introduction positions of the two or more kinds of precursors are determined such that, generally speaking, the precursor with lower reaction rate with the active species is introduced into the reaction space from upper stream position than the precursor with higher reaction rate.

In the present invention, since the transport pipes for precursors $(b_1)$, $(b_2)$ ... are located within the transport pipe (c) for the active species, the reaction between the precursors and the active species begins at the end portions of transport pipes for precursors $(b_1)$, $(b_2)$ ... i.e. the outlet ports for precursors, and the space from this position to the vicinity of the substrate may be considered to be the reaction space for the precursors and the active species.

Also, under the state where the starting gas for forming precursors is transported as such without excitation by an external energy before the starting gas comes out of the outlet ports of the transport pipes, and the excitation energy for formation of active species exists at the outlets of the transport pipes $(b_1)$, $(b_2)$ ..., or the active species has excitation energy in the vicinity of the outlet ports, the starting gas for precursors is activated to form precursors in the vicinity of the outlets of the transport pipes $(b_1)$, $(b_2)$ ..., and thereafter the reaction between the precursors and the active species will occur.

In this case, the vicinity of the outlets of the transport pipes $(b_1)$, $(b_2)$ ... may be deemed to be the activation spaces $(B_1)$, $(B_2)$ ... for formation of precursors, and the space thereafter to the vicinity of the substrate may be deemed to be the reaction space for the precursors and the active species.

In this case, as different from conventional plasma CVD, there exists no strong excitation energy which can form precursors in the vicinity of the substrate.

Figure 2:
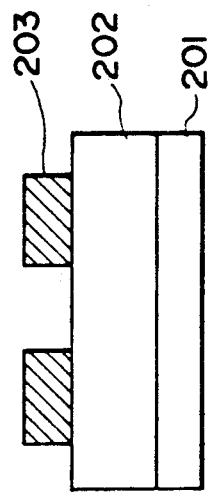
FIG. 2 is a schematic illustration showing the layer structure for explanation of one embodiment of the photoconductive member prepared by use of the process of the present invention.

Next, typical examples of formation of photoconductive members according to the process for forming a deposited film of the present invention are described in detail based on the apparatus for forming a deposited film shown in FIG. 1 and the constitution example of photoconductive member shown in FIG. 2.

The photoconductive member 200 shown in FIG. 2 has a layer structure constituted of a photoconductive layer 202 and gap type electrodes 203 on a support 201 for photoconductive member.

The support 201 in this example is required to be electrically insulating.

As the support 201, there may be ordinarily employed films or sheets of synthetic resins such as polyester, polyethylene, polycarbonate, celulose acetate, polypropylene, polyvinyl chloride, polyvinylidene choride, polystyrene, polyamide, etc., glasses or ceramics. The photoconductive layer 202 is constituted of an amorphous silicon germanium A-SiGeX(H), containing halogen atoms (X) and optionally hydrogen atoms (H) in a matrix of silicon atoms and germanium atoms so as to have photoconductive characteristics which can exhibit fully the function as a photoconductive member.

In the following, description is made about the case of forming an A-SiGe:FH film as the photoconductive layer 202.

FIG. 1 is an example of the apparatus for obtaining the deposited film of the present invention.

Through the gas introducing pipe 100, the starting gas for formation of active species such as $H_2$, $SiH_4$, $SiH_3F$, $GeH_4$, $Si_2H_6$, Ar, He, etc. is introduced into the activation space 101 (C), and active species is formed by the action of the activation energy source 102, and introduced through the transport space 103 (C) into the reaction space 112.

On the other hand, through the gas introducing pipe 104 into the activation space 105 ($b_1$), the starting gas for formation of a precursor containing silicon atoms such as $SiF_4$, $SiF_2H_2$, $Si_2F_6$, $SiF_3H$, etc. is introduced, and by the action of the activation energy sources 106 on these, the precursor containing silicon atoms is formed. The precursor containing silicon atoms formed is introduced through the transport space 107 into the reaction space 112. In the reaction space, it undergoes reaction with the active species to be changed to the state capable of contributing to deposition and deposited on the substrate.

On the other hand, through the gas introducing pipe 108 into the activation space 109 ($B_2$), the starting gas for formation of a precursor containing germanium atoms such as $GeF_4$, $GeCl_4$, etc. is introduced, and by the action of the activation energy source thereon, the precursor containing germanium atoms is formed. The precursor containing germanium atoms formed is introduced through the transport pipe 111 ($b_2$) into the reaction space 112.

Because the precursor containing silicon atoms has lower reaction rate as compared with the precursor containing germanium atoms, the outlet of transport pipe 107 for the precursor containing silicon atoms is situated within the reaction space 112 so as to encounter the active species at an upper stream position than the outlet of the transport pipe 111 for the precursor containing germanium atoms.

The precursor containing silicon atoms, because of having lower reaction rate with the active species as compared with the precursor containing germanium atoms, has no great influence on the characteristics of the film formed even when the precursor containing silicon atoms may be contained in the precursor containing germanium atoms.

The precursor containing silicon atoms and the precursor containing germanium atoms introduced into the reaction space 112 react respectively with the active species to be changed to more active precursors capable of directly contributing to deposition. Also, the reactions mutually between these active precursors may be expected.

Thus, the precursor containing silicon atoms and the precursor containing germanium atoms activated by the reaction with the activated species are introduced into the deposition space 113 (A), and deposited together to form a film on the substrate 116 mounted on the substrate holder 114 heated to a predetermined temperature with the heater 115.

In the process of deposition, it can be expected that the active species and the heat energy from the substrate will contribute greatly to rearrangement of silicon atoms and germanium atoms. The deposition space 113 is maintained at a desired pressure by an evacuation device 118 through a discharging pipe for vacuum 117.

As the result, a desired photoconductive layer 202 is deposited. The photoconductive layer 202 may have a layer thickness which may be suitably determined as desired depending on the purpose of application.

The layer thickness of the photoconductive layer 202, which may be suitably determined depending on the purpose of the semiconductor device to be applied, may be preferably 0.05 to 100$\mu$, more preferably 0.1 to 50$\mu$, most preferably 0.5 to 30$\mu$.

The amount of H or the sum of H and X (X=halogen atom such as F) contained in the photoconductive layer of the photoconductive member shown in FIG. 2 may be preferably 1 to 40 atomic %, more preferably 5 to 30 atomic %. As the amount of X alone, its upper limit may be preferably 10 atomic %, more preferably 1 atomic %, most preferably 0.5 atomic %. For making the photoconductive layer 202 n-type or p-type, if necessary, Group V atoms or Group III atoms in the periodic table or both impurities may be doped into the layer during layer formation while controlling its amount. As the impurity to be doped into the photoconductive member; as the p-type impurity, elements of the group III of the periodic table such as B, Al, Ga, In, Tl, etc. may be included as preferable ones, while as the n-type impurity, elements of the group V of the periodic table such as N, P, As, Sb, Bi, etc. may be included as preferably ones. Particularly, B, Ga, P and Sb are most preferred.

For having a desired conduction type, the amount of the impurity to be doped into the photoconductive layer 202 may be suitably determined depending on the desired electrical and optical characteristics, and it may be doped in the amount range of $3 \times 10^{-2}$ atomic % or less in the case of the impurity of the group III of the periodic table, while it may be doped in the amount range of $5 \times 10^{-3}$ atomic % or less in the case of the impurity of the group V of the periodic table.

For doping of the impurity into the photoconductive layer 202, a starting material for introduction of the impurity may be introduced during layer formation under gaseous state into the activation space (C) or the activation spaces $(B_1)$, $(B_2)$ . . . for formation of precursors. During the operation, the starting material is introduced together with either of the starting gases for precursors or the starting gas for the active species.

As the starting substance for introduction of such impurity, there may be employed those which are gaseous at normal temperature and normal pressure or readily gasifiable at least under the layer forming conditions. Specific examples of such starting materials for introduction of impurities may include $PH_3$, $P_2H_4$, $PF_3$, $PF_5$, $PCl_3$, $AsH_3$, $AsF_3$, $AsF_5$, $AsCl_3$, $SbH_3$, $SbF_5$, $BF_3$, $BCl_3$, $BBr_3$, $B_2H_6$, $B_4H_{10}$, $B_5H_9$, $B_5H_{11}$, $B_6H_{10}$, $B_6H_{12}$, $AlCl_3$, etc. The gap electrodes 203 may be formed after formation of the photoconductive layer 202, or on the contrary the photoconductive layer 202 may be formed after formation of the gap electrodes 203 on the substrate 201.

As the gap electrodes 203, all electroconductive materials may be employed, but preferably those forming ohmic contact with the photoconductive layer 202 are desirable.

As the electroconductive material forming ohmic contact, when a non-doped A-SiX(H) film is used as the photoconductive layer 202, a metal with low work function such as Al, In, etc., or an A-SiX(H) film doped abundantly with the group V element such as P, As, etc. (usually 100 ppm or more) to be lowered in resistance may be used.

Figure 3:
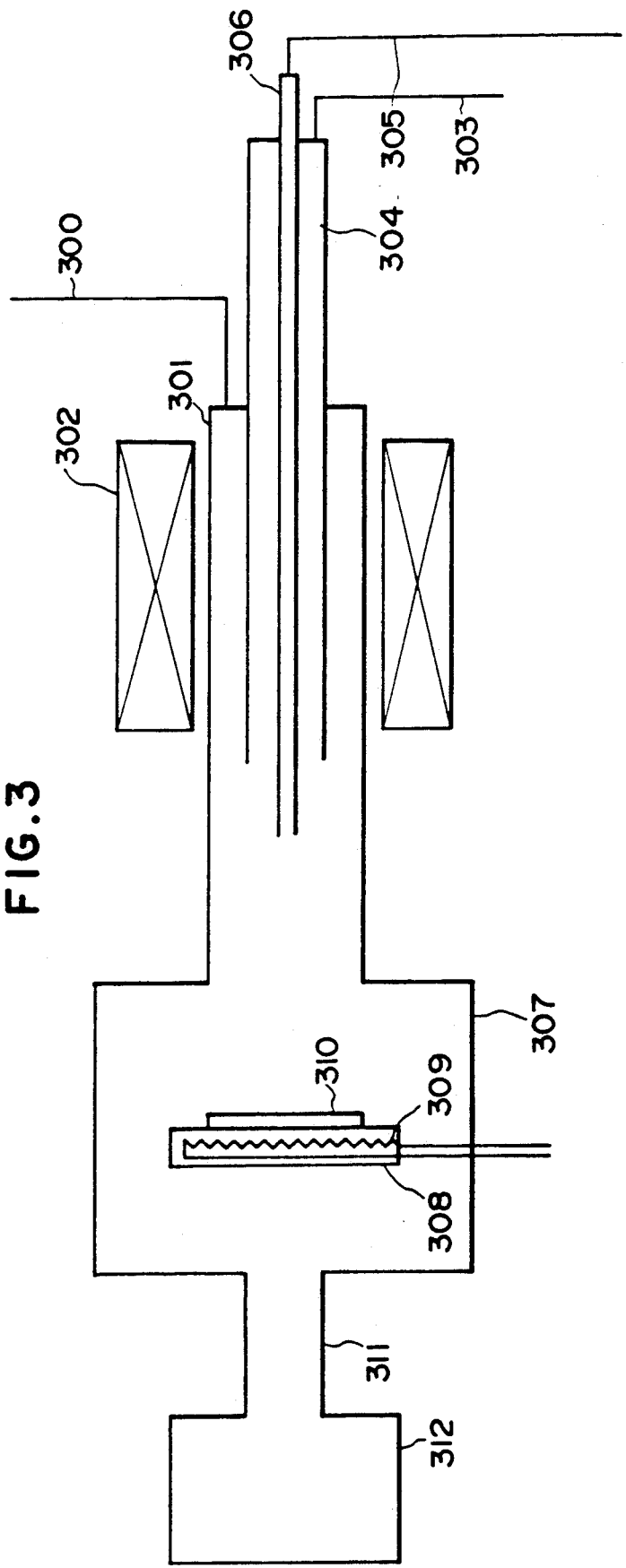

The device shown in FIG. 3 is a modified example of the device in FIG. 1, and the starting gas for the active species is introduced from the gas introducing pipe 300 into the active species transport pipe 301 (C) which also functions as the activation space. In the active species transport pipe 301 which also functions as the activation space, the starting gas for formation of active species is activated by the action of the activation energy source 302 to form active species. The activation space 301 functions as both the transport pipe for the active species and the reaction space for the active species with precursors, and is communicated to the film forming space 307.

On the other hand, the starting gas for the precursor containing silicon atoms is introduced through the gas introducing pipe 303 into the gas transport pipe 304(b). The gas transport pipe 304 is positioned internally of the active species transport pipe 301, and may sometimes receive the action by the activation energy source 302 to form precursors in the gas transport pipe 304. Also, when the material or the composition of the gas transport pipe 304 is made so as to shield the energy from the activation energy source 302, the starting gas as such is conveyed through the gas transport pipe 304 to come into the active species transport pipe 301.

The starting gas for formation of the precursor containing silicon atoms introduced into the active species transport pipe 301 is activated by the action of the activation energy source 302 and the precursor is formed on coming out from the gas transport pipe 304.

The precursor containing silicon atoms formed in the gas transport pipe 304 or in the vicinity on coming out therefrom is mixed with the active species in the vicinity of the outlet of the active species pipe 301 to be changed to a more active precursor and led to the deposition space 307(A).

Alternatively, when the life of the precursor containing silicon atoms is sufficiently long as compared with the life of the active species, the starting gas for forming the precursor containing silicon atoms may be activated before it reaches the gas transport pipe 304 for previous formation of the precursor. On the other hand, the starting gas for the precursor containing germanium atoms is introduced through the gas introducing pipe 305 into the gas transport pipe 306($b_2$). The gas transport pipe 306 is positioned internally of the active species transport pipe 301 and the gas transport pipe 304, and may sometimes receive the action of the activation energy source 302 to form the precursor in the gas transport pipe 306. Also, when the material and the construction of the gas transport pipes 304 and 306 are made so as to shield the energy from the activation energy source 302, the starting gas as such is conveyed through the gas transport pipe 306 to come into the active species transport pipe 301.

The starting gas for formation of the precursor containing germanium atoms introduced into the active species transport pipe 301 is activated by the action of the activation energy source 302 and the precursor is formed on coming out from the gas transport pipe 304.

The precursor containing germanium atoms formed in the gas transport pipe 306 or in the vicinity on coming out therefrom is mixed and reacts with the active species in the vicinity of the outlet of the active species pipe 301 to be changed to a more active precursor and is introduced to the deposition space.

Alternatively, similarly as in the case of the precursor containing silicon atoms, the starting gas for formation of the precursor containing germanium atoms may be activated before it reaches the gas transport pipe 306 for previous formation of the precursor.

Here, since the precursor containing silicon atoms is lower in the reaction rate with the active species as compared with the precursor containing germanium atoms, the constitution is so made that it may be mixed earlier with the active species.

The precursor containing silicon atoms and the precursor containing germanium atoms further activated by the reaction with the active species (A) are introduced into the deposition space 307 and reach the substate 310 mounted on the substrate holder 308 heated to a desired temperature by the heater 309 to form a desired A-SiGe film. The deposition space 307 is evacuated by the vacuum evacuation device 312 through the vacuum discharging pipe 311.

Figure 4:
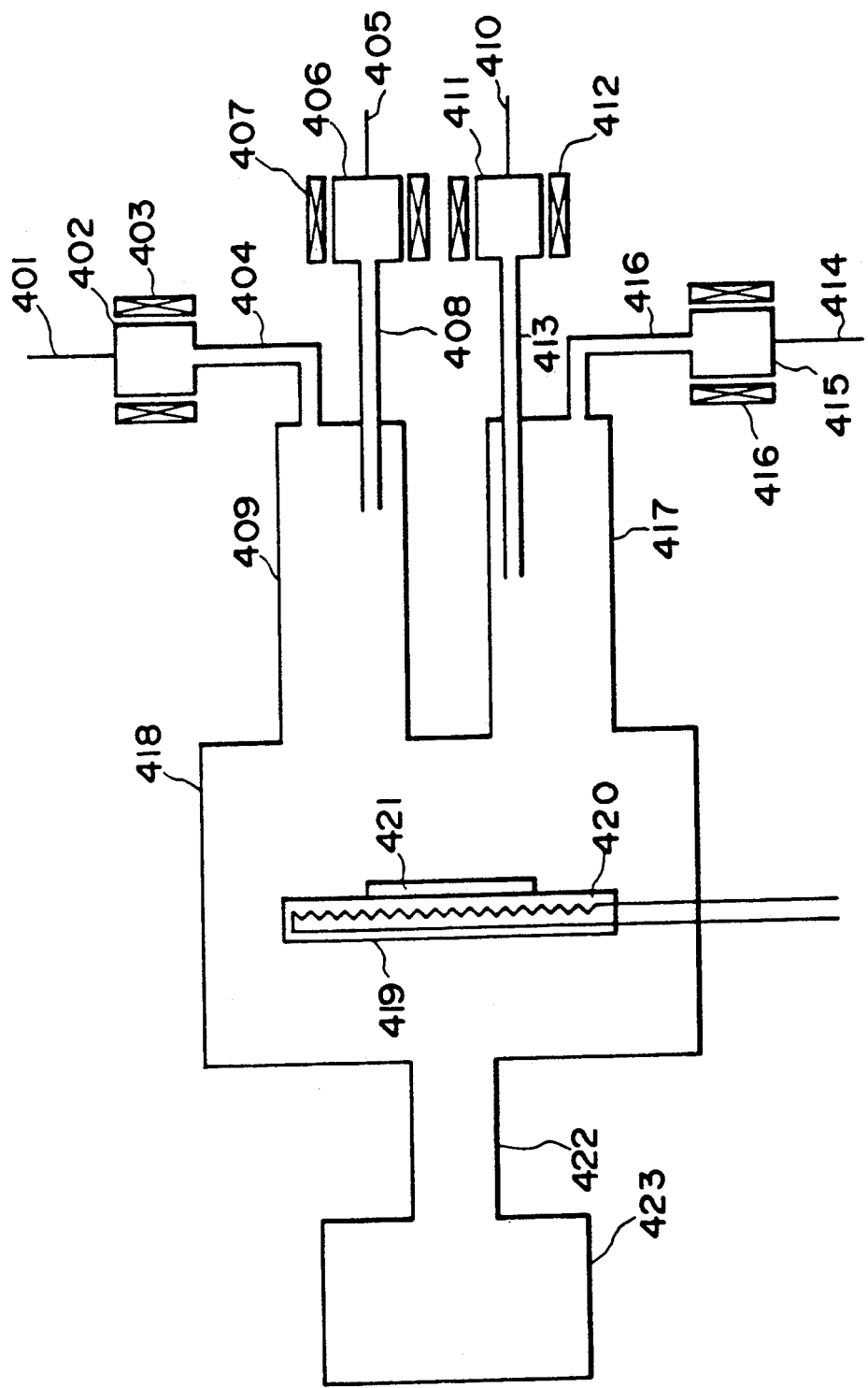

The device shown in FIG. 4 is another modified example of the device shown in FIG. 1, which is designed so that the reaction of the precursor containing silicon atoms with the active species and the reaction of the precursor containing gemanium atoms with the active species may be performed in separate reaction spaces.

The starting gas for forming the active species from the gas introducing pipe 401 is introduced into the activation space 402(C) and activated by the action of the activation energy source 403 to form an active species. The active species formed is led through the active species transport pipe 404(C) into the reaction space 409. At the same time, from the gas introducing pipe 405 is introduced the starting gas for the precursor containing silicon atoms into the activation space 406($b_1$), where the precursor containing silicon atoms is formed by activation by the action of the activation energy 407. The precursor formed is led into the reaction space 409 through the precursor transport pipe 408($b_1$). As the result, in the reaction space 409, the precursor containing silicon atoms and the active species undergo the chemical reaction to become a more active precursor having deposition ability, which is then led into the deposition space 418.

At the same time, the starting gas for an active species is introduced from the gas introducing pipe 414 into the activation space 415(C), where the active species is formed by activation by the action of the activation energy source 416. The active species formed is led through the active species transport pipe 416(C) into the reaction space 417. At the same time, the starting gas for the precursor containing germanium atoms is introduced through the gas introducing pipe 410 into the activation space 411($B_2$), where it is activated by the action of the activation energy source 412 to form the precursor containing germanium atoms. The precursor containing germanium atoms formed is led through the precursor transport pipe 413($b_2$) into the reaction space 417. As the result, the precursor containing germanium atoms and the active species undergo chemical reaction in the reaction space to form a more active precursor having deposition ability, which is then led into the deposition space 418(A).

Based on the reaction rates of the precursor containing silicon atoms led through the precursor transport pipe 408 into the reaction space 409 and the precursor containing germanium atoms led through the precursor transport pipe 413 into the reaction space 417, the positions of the outlets of the precursor transport pipes 408 and 413 are determined.

In the reaction spaces, the precursors having more active deposition abilities reach the substrate 421. 419 is a substrate holder, 420 a heater, 422 a vacuum discharging pipe and 423 a vacuum evacuation device.

Figure 5:
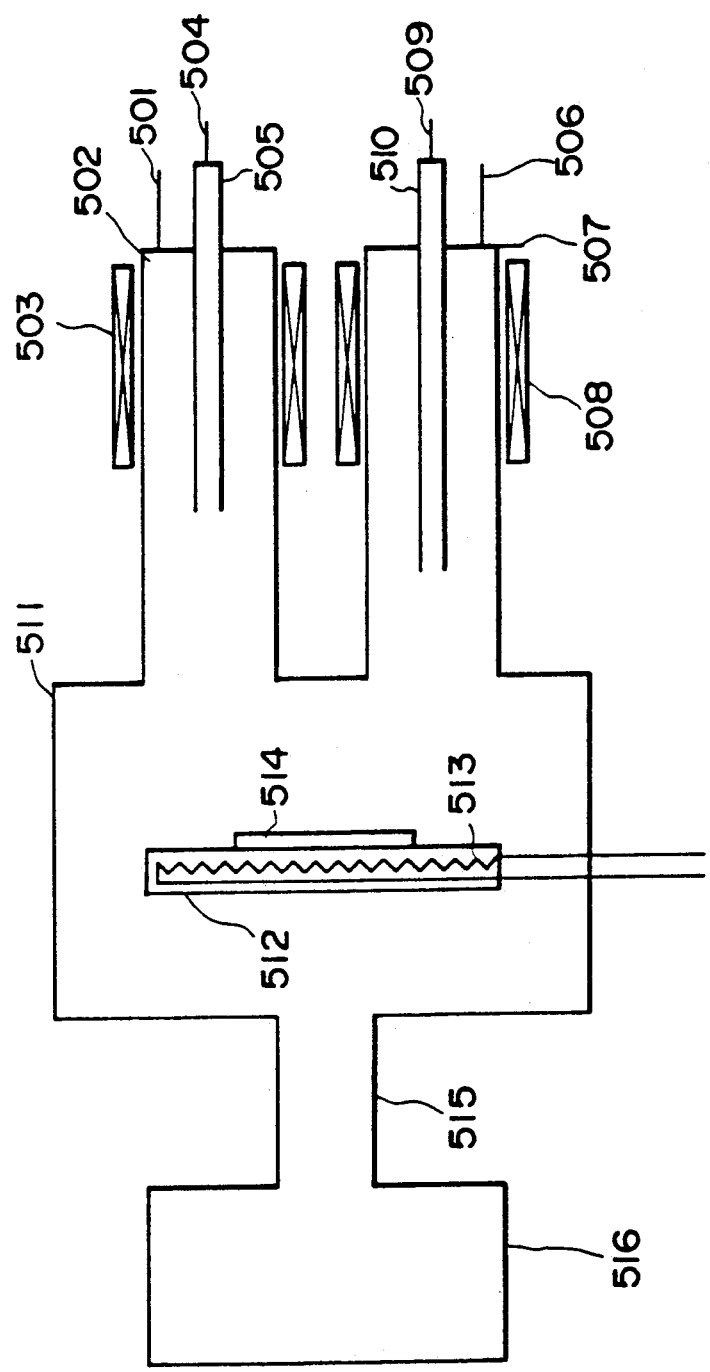

The device shown in FIG. 5 is a modified example of the device shown in FIG. 1 or FIG. 3, and a starting gas for an activated species is introduced into the active species transport pipe 502(C) which also functions as the activation space(C) through the gas introducing pipe 501. In the active species transport pipe 502 which also functions as the activation space, the gas is activated by the action of the activation energy source 503 to form an active species. The activation space 502 functions as both the transport pipe of active species and the reaction space for the active species with precursors, and is communicated to the film forming space 511.

On the other hand, the starting gas for the precursor containing silicon atoms is introduced into the gas transport pipe 505($b_1$) through the gas introducing pipe 504. The gas transport pipe 505 is positioned internally of the active transport pipe 502, and may sometimes receive the action of the activation energy source 503 to form the precursor in the gas transport pipe 505. Also, when the material or the constitution of the gas transport pipe 505 is made so as to shield the energy from the activation energy source 503, the starting gas as such is conveyed through the gas transport pipe 505 to come into the active species transport pipe 502.

The starting gas for formation of the precursor containing silicon atoms introduced into the active species transport pipe 505 is activated by the action of the activation energy source 503, and the precursor is formed on coming out from the gas transport pipe 505.

The precursor containing silicon atoms formed in the gas transport pipe 505 or in the vicinity coming out therefrom is mixed with the active species in the vicinity of the outlet of the active species transport pipe 502 to undergo the reaction to be changed to a more active precursor, which is then led to the deposition space 511.

Alternatively, when the life of the precursor containing silicon atoms is sufficiently long as compared with the life of the active species, the starting gas for forming the precursor containing silicon atoms may be activated before it reaches the gas transport pipe 505 for previous formation of the precursor.

Similarly, a starting gas for an active species is introduced through the gas introducing pipe 506 into the active species transport pipe 507(C) which also functions as the activation space(C). In the active species transport pipe 507 which also functions as the activation space, an active species is formed by activation of the activation energy source 508. The activation space 507 also functions as both the transport pipe of active species and the reaction space of the active species with precursors and is communicated to the film forming space 511.

On the other hand, the starting gas for the precursor containing germanium atoms is introduced through the gas introducing pipe 509 into the gas transport pipe 510($b_2$). The gas transport pipe 510 is positioned internally of the active species transport pipe 507, and may sometimes receive the action of the activation energy source 508 to form the precursor in the gas transport pipe 510. Also, when the material or the construction of the gas transport pipe 510 is made so as to shield the energy from the activation energy source 508, the starting gas as such is coneyed through the gas transport pipe 510 to come into the active species transport pipe 507.

The starting gas for formation of the precursor containing germanium atoms introduced into the active species transport pipe 507 is activated by the action of the activation energy source 508, and the precursor is formed on coming out from the gas transport pipe 510.

The precursor containing germanium atoms formed in the gas transport 510 or in the vicinity coming out therefrom is mixed with the active species in the vicinity of the outlet of the active species transport pipe 507 to undergo the reaction therewith to be changed to a more active precursor, which is then led into the deposition space 511(A).

Alternatively, similarly as in the case of the precursor containing silicon atoms, the starting gas for formation of the precursor containing germanium atoms may be activated before it reaches the gas transport pipe 509 for previous formation of the precursor.

The precursor containing silicon atoms and the precursor containing germanium atoms which are introduced into the deposition space 511 and are activated to have deposition abilities reach the substrate 514 placed in the deposition space and heated to a desired temperature to form a film comprising Si and Ge. 512 is a substrate holder, 513 a heater, 515 a vacuum discharging pipe and 516 a vacuum evacuation device.

Having described above about the process for forming A-SiGe:FH film, the present invention is not limited to this, but can be also used for deposition of a film comprising two or more elements, containing F and H or a halogen atom and H in the film, such as A-SiC:FH, C-SiGe:FH, C-GaAs:FH, A-GaAs:FH, C-ZnSe:H, etc.

EXAMPLE 1

By use of the apparatus shown in FIG. 1, an amorphous silicon-germanium film containing F and H (A-SiGe:FH film) with the constitution shown in FIG. 2 was formed on a glass substrate.

In this Example, the outlet of the transport pipe for the precursor containing silicon atoms was set at a position of 70 mm from the boundary between the reaction space 112 and the film forming space 113, and the blowing nozzle of the transport pipe for the precursor containing germanium atoms similarly at a position of 30 mm.

In the film forming space 113 was placed a glass substrate on the substrate holder, and the film forming space 113 and the reaction space 112 were made to a vacuum degree of about $10^{-6}$ Torr by opening the evacuation valve (not shown). Next, the glass substrate temperature was maintained at about 250° C. by the heater 115. Next, H$_2$ gas as the starting gas for formation of active species was introduced into the activation space 101 at 100 SCCM.

Into the activation space 105, SiF$_4$ (100%) was simultaneously introduced at 150 SCCM as the starting gas for formation of the precursor containing silicon atoms.

On the other hand, into the activation space 109, GeF$_4$ (100%) was introduced at 1.5 SCCM as the starting gas for formation of the precursor containing germanium atoms. After the flow rate was stabilized, the inner pressure in the deposition space was made about 0.2 Torr by controlling the evacuation valve. After the inner pressure became constant, the microwave power sources 102, 106 and 110 were respectively actuated to throw discharging energies of 160 W, 80 W and 40 W, respectively, into the activation chambers 101, 105 and 109.

This state was maintained for 30 minutes to form an A-SiGe:FH film with a thickness of about 1.2 μ on the glass substrate 116 in the film forming space 113. When the composition of the thus prepared A-SiGe:HF film was measured by XMA, it was found to be a uniform film on the whole surface with Si/Ge=1/1. Also, the optical band gap was measured by measurement of optical absorption to be 1.4 eV.

Also, comb-shaped Al electrodes (gap length 2.5 cm, gap interval 0.2 mm) were attached to about 500 Å on the surface of the film by the vacuum vapor deposition method, and the current was measured by application of a voltage, the ratio of current during irradiation of light of 700 nm to that under dark condition was found to be $10^{5.0}$.

COMPARATIVE EXAMPLE

In Example 1, using only the gas introducing pipe 104 as the gas introducing pipe for the starting gas for forming precursor, a gas mixture of SiF$_4$ at 150 SCCM and GeF$_4$ at 1.5 SCCM was permitted to flow, and film formation was effected under otherwise the same conditions as in Example 1. As the result, the film obtained has a composition of Si/Ge with Ge content being 10% or less.

Also, the characteristics of the film were very poor with the current during irradiation of light of 700 nm being substantially equal to that under dark condition. Further, in the reaction space 112, a film containing an extremely large amount of Ge was formed.

Accordingly, the position of the outlet of the precursor transport pipe 107 was controlled to be placed at a position of 20 mm from the boundary between the reaction space 112 and the film forming space 113, and also with increased flow rate of H$_2$ gas to 250 SCCM, microwave powers of 200 W and 60 W were respectively applied in the activation space 102 and the activation space 106 to effect film formation for 120 minutes, whereby an A-SiGe:FH film with a film thickness of 1.0 μm was obtained. The Si/Ge composition of the film obtained was 7/3, with the optical band gap being 1.55 eV. The ratio of current during light irradiation to that under dark condition was about $10^{1.2}$ for the light of 700 nm, and about $10^3$ for the light of 600 nm.

However, according to the method in which SiF$_4$ gas and GeF$_4$ gas are thus permitted to flow in a mixture, no film with good characteristics could be obtained, even when film forming conditions such as the distance of the outlet for the precursor, the flow rate of H$_2$ and the microwave power were made to give a film with an optical band gap of smaller than 1.55 eV. That is, a film with an optical band gap smaller than 1.55 ev was found to be a film with small photocurrent during light irradiation.

EXAMPLE 2

In Example 1, in place of flowing GeF$_4$ (100%) gas through the gas introducing pipe 108, GeF$_4$/SiF4 (10%) gas was permitted to flow at 15 SCCM, and film formation was effected under otherwise the same conditions. As the result, the A-SiGe:FH film obtained had substantially equal characteristics with a composition of approximately 1/1, an optical band gap of 1.43 eV and a current ratio during irradiation of light of 700 nm relative to that under dark condition of about $10^{4.5}$.

EXAMPLE 3

By use of the apparatus shown in FIG. 3, deposition of an A-SiGe:FH film was performed according to the following procedure.

Through the gas introducing pipe 300, H$_2$ gas was permitted to flow at 50 SCCM and Ar gas at 250 SCCM, and also through the gas introducing pipe 303, SiF$_4$ gas at 60 SCCM, and through the gas introducing pipe 305, GeF$_4$ gas at 6 SCCM. The gas transport pipes 304 and 306 were made of stainless steel, and no electrical field of microwave is applied internally thereof. Accordingly, it may be considered that there is no formation of precursor internally of the gas transport pipes 304 and 306.

The active species transport pipe 301 which functions as both the activation space and the reaction space is made of quartz, mounted with a microwave energy source 302 outside thereof, thus having a structure such that plasma of glow discharging can be effected internally thereof by the microwave electrical field.

Under the state where the above gases were flowed and the pressure in the film forming space 307 and the active species transport pipe 301 is controlled to 0.4 Torr, a microwave electrical field is applied from the microwave energy source 302 302 to effect plasma discharging of $H_2$ and Ar in the active species transport pipe 301. The microwave electrical field is broadened by the plasma of $H_2$ and Ar through the stainless steel pipes 304 and 306, and therefore it is within the plasma to about 1 cm ahead of the gas transport pipe for precursor 306.

Therefore, $SiF_4$ gas and $GeF_4$ gas blown out from the gas transport pipes 304 and 306 for precursors are both excited in the plasma to form precursors of $SiF_n$ and $GeF_n$ (n=1-3), respectively.

In this Example, the positions of the blowing nozzles of the gas transport pipe 304 for precursor and the gas transport pipe 306 for precursor were set at positions of 40 mm and 60 mm, respectively, from the boundary between the film forming space 307 and the active species transport pipe 304. The precursors of $SiF_n$, $GeF_n$ formed reacted chemically with the H active species in the active species transport pipe 304 to be changed to precursors having more active deposition abilities and reach the glass substrate placed in the film forming space 307 and heated by the heater 309 to about 200° C.

When this state was maintained for 30 minutes, an A-SiGe:FH film with a thickness of about 1.1 μm was formed on the glass substrate. The composition was examined by XMA to be Si/Ge=1/1, with the optical band gap being 1.4 eV. The current ratio during 700 nm light irradiation relative to that during dark condition was about $10^5$.

EXAMPLE 4

By use of the apparatus shown in FIG. 4, an A-SiGe:FH film was deposited according to the procedure as described below.

Through each of the gas introducing pipes 401 and 411, mixed gas of $H_2$ gas at 50 SCCM and Ar gas at 50 SCCM was permitted to flow to be introduced into the activation spaces 402 and 415. In the activation spaces 402 and 415, the microwave power sources 403 and 416 were actuated respectively to 200 W to form active species. The active species formed composed mainly of H atoms were introduced through the active species transport pipes 404 and 416 respectively into the reaction spaces 409 and 417.

Also, at the same time, $SiF_4$ gas at 100 SCCM was introduced through the gas introducing pipe 405 into the activation space 406. In the activation space 406, discharge energy of 80 W was applied by the action of the microwave power source 407 to form $SiF_n$ active species. The $SiF_n$ active species formed was introduced through the precursor transport pipe 408 into the reaction space 409. The $SiF_n$ and H species introduced into the reaction space 409 reacted chemically with each other to become a precursor having activated deposition ability, which was introduced into the film forming space 418.

At the same time, $GeF_4$ gas at 1 SCCM was introduced through the gas introducing pipe 410 into the activation space 411. In the activation space 411, discharge energy of 70 W was applied by the action of the microwave power source 412 to form $GeF_n$ active species. The $GeF_n$ active species formed was introduced through the precursor transport pipe 413 into the reaction space 417. The $GeF_n$ and H active species introduced into the reaction space 417 reacted chemically with each other to form a precursor having activated deposition ability, which was introduced into the film forming space 418.

The precursor containing silicon atoms having activated deposition ability introduced from the reaction space 409 into the film forming space 418 and the precursor containing germanium atoms having activated deposition ability introduced from the reaction space 417 into the film forming space 418 are deposited on the glass substrate 421 heated by the heater 420 to about 250° C. to form a film of A-SiGe:HF.

During this operation, the pressure in the film forming space 418 and the reaction spaces 409 and 417 were controlled to 0.1 Torr.

The positions of the transport pipe 408 for the $SiH_n$ precursor and the transport pipe 413 for the $GeF_n$ precursor, in view of the difference in the reaction rate between SiFn and H active species and between $GeF_n$ and H active species, were set at 29 mm and 20 mm respectively from the boundary of the reaction spaces 409 and 417 and the film forming space 418.

When this state was maintained for 90 minutes, a film of A-SiGe:FH film with a thickness of about 1.5 μm was formed on the glass substrate 421. The film obtained was measured by XMA, whereby Si/Ge ratio was found to be 1/1. The optical band gap was 1.40 eV.

This sample was attached with the same comb-shaped Al electrodes as in Example 1 and irradiated with light of 700 nm, to give the result that the ratio of electroconductivity during irradiation to that during darkness was $10^5$. In FIG. 4, 419 represents a substrate holder, 422 a pipeline for vacuum evacuation and 423 a vacuum evacuation device.

EXAMPLE 5

By use of the apparatus shown in FIG. 5, an A-SiGe:FH film was deposited according to the procedure as described below.

Through the gas introducing pipe 501, into the activation space 502 for preparation of active species, $H_2$ gas at 30 SCCM and Ar gas at 100 SCCM were permitted to flow, and also $SiF_4$ gas at 60 SCCM was permitted to flow through the gas introducing pipe 504.

The activation space 502 has a structure which functions as both the transport pipe for active species and the reaction space for the active species and precursors.

The $H_2$ gas introduced into the activation space 502 is activated by the microwave of 200 W applied from the microwave power source 503 to form H active species. The gas transport pipe 505 and the activation space 502 are made of quartz glass pipes arranged concentrically, and the $SiF_4$ gas introduced into the gas transporting pipe 505 receives the microwave electric field, but the electric field intensity of the microwave applied is small due to the skin effect of the microwave. Therefore, substantially no plasma is generated in the gas transport pipe 505.

Accordingly, the outlet of the gas transport pipe 505 was placed in the hydrogen and argon plasma so that the SiF₄ gas coming out of the gas transport pipe 505 could be activated in the plasma to form SiF$_n$ precursor.

The plasma at this time was made to exist to the position about 10 mm ahead of the outlet of the gas transport pipe 505. Also, the position of the outlet of the gas introducing pipe 505 was set at about 20 mm from the boundary of the activation space 502 which also functions as a reaction space and the film forming space 511.

The precursor SiF$_n$ formed reacted chemically with the H active species in the vicinity of the outlet of the activation space 502 which also functioned as a reaction space to form a precursor containing silicon atoms having more active deposition ability, which was then introduced into the deposition space 511.

Also, through the gas introducing pipe 506, into the activation space 507 for preparation of active species, H₂ gas at 30 SCCM and Ar gas at 100 SCCM were permitted to flow, and also through the gas introducing pipe 509, GeF₄ gas was permitted to flow at 60 SCCM.

The activation space 507 has a structure which functions as both the transport pipe for active species and the reaction space for the active species and precursors.

The H₂ gas introduced into the activation space 507 is activated by the microwave of 200 W applied from the microwave power source 508 to form H active species. The gas transport pipe 510 and the activation space 507 are made of quartz glass pipes arranged concentrically, and the GeF₄ gas introduced into the gas transporting pipe 510 receives the microwave electric field, but the electric field intensity of the microwave applied is small due to the skin effect of the microwave. Therefore, substantially no plasma is generated in the gas transport pipe 510.

Accordingly, the outlet of the gas transport pipe 510 was placed in the hydrogen and argon plasma so that the GeF₄ gas coming out of the gas transport pipe 510 could be excited in the plasma to form GeF$_n$ precursor.

The plasma at this time was made to exist at the position about 3 mm ahead of the outlet of the gas transport pipe 510. Also, the position of the outlet of the gas introducing pipe 505 was set at about 12 mm from the boundary of the activation space 507 which also functions as a reaction space and the film forming space 511.

The precursor GeF$_n$ formed reacted chemically with the H active species in the vicinity of the outlet of the activation space 507 which also functioned as a reaction space to form a precursor containing germanium atoms having more active deposition ability, which was then introduced into the film forming space 511.

The precursor containing silicon atoms and the precursor containing germanium atoms having activated deposition abilities introduced into the film forming space reached the glass substrate 514 heated by the heater to 250° C. During this operation, the film forming space 511 and the reaction spaces 502 and 507 were internally evacuated by the vacuum evacuation device 516 to a pressure of 0.3 Torr.

This state was maintained for 90 minutes, and then the substrate temperature was dropped to room temperature, whereupon vacuum was broken to take out the glass substrate. As the result, an A-SiGe:FH film with a thickness of about 1.6 μm was found to be formed.

The composition of the A-SiGe:FH film obtained was analyzed by XMA to find that Si/Ge was equal to 1/1. The optical energy gap was measured to be 1.42 eV.

Similarly as in Example 1, comb-shaped electrodes of Al were mounted on the surface of the A-SiGe:FH film for measurement of electroconductivity. As the result, the ratio of electroconductivity during irradiation of light of 700 nm to that during darkness was found to be $10^{4.5}$.

EXAMPLE 6

By use of the apparatus in FIG. 4, through the gas introducing pipe 401, H₂ gas at 70 SCCM and Ar at 70 SCCM were permitted to flow and 200 W of microwave power was applied to form H active species. Also, through the gas introducing pipe 405, SiF₄ at 100 SCCM was permitted to flow and 80 W of microwave power was applied to form SiF$_n$ precursor. The SiF$_n$ precursor was allowed to react with the H active species in the reaction space 409 to be changed to a precursor having deposition ability, which was then introduced into the film forming space 418.

At the same time, through the gas introducing pipe 414, H₂ gas at 70 SCCM, Ar 70 SCCM were permitted to flow and 200 W of microwave power was applied to form H active species. Through the gas introducing pipe 410, C₂F₆ at 80 SCCM was permitted to flow and 100 W of microwave power was applied to form C$_m$F$_n$ precursor. The C$_m$F$_n$ precursor was allowed to react with the H active species in the reaction space 417 to be changed to a precursor having deposition ability, which was then introduced into the deposition space 418.

The precursor containing silicon atoms and the precursor containing carbon atoms introduced into the film forming space reached the glass substrate 421 heated to 200° C. to form an A-SiC:FH film. During this operation, the pressure in the film forming space and the reaction spaces 409 and 417 were maintained at 0.3 Torr.

The transport pipe 408 for the precursor containing silicon atoms was set at 29 mm from the boundary between the reaction space 409 and the deposition space 418, and the transport pipe 413 for the precursor containing carbon atoms at 35 mm from the boundary between the reaction space 417 and the film forming space 418. When this state was kept for 120 minutes, an A-SiC:FH film with a thickness of 0.6 μm could be formed on the glass substrate 421. The composition of the film obtained was analyzed by XMA to find that the ratio of Si to C was 3:2 and the optical band gap 2.1 eV.

Al electrodes were attached similarly as in Example 1 for measurement of electroconductivity by irradiation of light of 400 nm. As the result, a ratio of $10^4$ relative to the electroconductivity during darkness could be obtained.

EXAMPLE 7

By use of the apparatus in FIG. 5 similarly as in Example 5, with H₂ flow rate being 200 SCCM, Ar flow rate 50 SCCM through the gas introducing pipe 501, and SiF₄ flow rate 30 SCCM through the gas introducing pipe 504, 200 W of microwave power was applied from the microwave power source 503. Also, with H₂ flow rate being 200 SCCM, Ar flow rate 50 SCCM through the gas introducing pipe 507, and GeF₄ flow rate 0.2 SCCM through the gas introducing pipe 510, 180 W microwave power was applied from the microwave power source 508. With the pressure in the film forming space 511 and the reaction spaces 502 and 507 maintained at 90 mTorr, a film of SiGe was deposited on a glass substrate heated to 300° C.

After deposition for about 60 minutes, a SiGe film with a thickness of 0.6 μm was found to grow on the substrate. As the result of electron beam diffraction, it was found to be crystallized to about a grain size of about 500 Å.

EFFECT OF THE INVENTION

As described above in detail, in a process for forming a deposited film by introducing into a film forming space for forming a deposited film on a substrate two or more kinds of precursors which are starting materials for formation of a deposited film formed in the activation space (B) and an active species formed in the activation space (A) which interacts mutually with the above two or more kinds of precursors, thereby forming a deposited film on the above substrate, when the reaction rates with the active species differ between the two or more kinds of precursors. by making the mixing position of the respective precursors and the active species so that the precursor with lower reaction rate with the active species may be at upper stream side than the precursor with higher reaction rate, the precursor with higher reaction rate can be prevented from being deposited on the wall before reaching the substrate, whereby an alloy film constituted as matrix of two or more kinds of elements with a desired composition and having uniform and good characteristics can be obtained on the substrate. Also, film formation has become possible with good reproducibility without remarkable contamination of the reaction space.

We claim:

1. A process for forming a deposited film on a substrate in a deposition space (A) which comprises:
   (i) forming a plurality of different precursors in a plurality of activation spaces (B) from gaseous materials for forming the deposited film;
   (ii) forming an active species in an activations space (C), said active species capable of reacting with at least two of said precursors at different reaction rates; and
   (iii) introducing said plurality of precursors and said active species into said deposition space (A) so as to form a mixture and effect film formation, wherein said plurality of precursors are introduced such that one of said precursors which reacts with said active species at a lower reaction rate is mixed with said active species at an upper stream position as compared with another of said precursors which reacts with said active species at a higher reaction rate.

2. The process of claim 1 wherein said precursors are allowed to pass through said activation space (C) in a manner so as to prevent the contact of said precursors with said active species.

3. The process of claim 1 wherein said precursor of lower reaction rate and said precursor of higher reaction rate are mixed with the same kind of active species individually in different spaces.

4. The process of any of claims 1-3 wherein said active species is H active species, said precursor of lower reaction rate is $SiX_n$ (X is halogen; n=1, 2 or 3), and said precursor of higher reaction rate is $GeX_m$ (m=1, 2 or 3).

5. The process of any of claims 1-3 wherein said active species is H active species, said precursor of lower reaction rate is $SiX_n$ (X is halogen; n=1, 2 or 3), and said precursor of higher reaction rate is $CX_m$ (m=1, 2 or 3).

6. The process of claim 4 or 5 wherein X is F.

7. The process of claim 1 wherein a starting gas containing an impurity controlling electrical conduction type is further introduced into the activation space (B) or (C), said impurity including atoms selected from the group consisting of Group III and Group V elements.

8. A process for forming a deposited film on a substrate in a deposition space (A) which comprises:
   (i) activating a first gaseous material in an activation space $(B_1)$;
   (ii) activating a second gaseous material in an activation space $(B_2)$;
   (iii) activating a third gaseous material in an activation space (C); and
   (iv) mixing the activated first gaseous material and the activated second gaseous material with the activated third gaseous material in order to react said activated third gaseous material with one of said activated first and second gaseous materials at a lower reaction rate at an upper stream position as compared to the other of said first and second activated gaseous materials which reacts with said active species at a higher reaction rate.

* * * * *

UNITED STATES PATENT AND TRADEMARK OFFICE
CERTIFICATE OF CORRECTION

PATENT NO. : 5,126,169
DATED : June 30, 1992
INVENTOR(S) : SHUNICHI ISHIHARA ET AL.   Page 1 of 3

It is certified that error appears in the above-identified patent and that said Letters Patent is hereby corrected as shown below:

COLUMN 2

Line 40, "object" should read --objects--.
    Line 61, close up right margin.
    Line 62, close up left margin.

COLUMN 3

Line 6, "respectively" should read --respectively,--.

COLUMN 5

Line 65, "103(C)" should read --103(c)--.
    Line 68, "105($b_1$)" should read --105($B_1$)--.

COLUMN 6

Line 6, "107" should read --107($b_1$)--.

COLUMN 7

Line 8, "ber;" should read --ber,--.
    Line 12, "preferably" should read --preferable--.
    Line 59, "301(C)" should read --301(c)--.
    Line 60, "space." should read --space (C).--.

UNITED STATES PATENT AND TRADEMARK OFFICE
CERTIFICATE OF CORRECTION

PATENT NO. : 5,126,169
DATED : June 30, 1992
INVENTOR(S) : SHUNICHI ISHIHARA ET AL.    Page 2 of 3

It is certified that error appears in the above-identified patent and that said Letters Patent is hereby corrected as shown below:

COLUMN 8

Line 3, "304(b)." should read --304($b_1$).--.

COLUMN 9

Line 9, "gemanium" should read --germanium--.
Line 17, "404(C)" should read --404(c)--.
Line 35, "416(C)" should read --416(c)--.
Line 63, "502(C)" should read --502(c)--.

COLUMN 10

Line 37, "507(C)" should read --507(c)--.

COLUMN 12

Line 42, "1.55 ev" should read --1.55 eV--.

COLUMN 13

Line 13, "302" (second occurrence) should be deleted.

COLUMN 17

Line 35, "activations" should read --activation--.

UNITED STATES PATENT AND TRADEMARK OFFICE
CERTIFICATE OF CORRECTION

PATENT NO. : 5,126,169
DATED : June 30, 1992
INVENTOR(S) : SHUNICHI ISHIHARA ET AL. Page 3 of 3

It is certified that error appears in the above-identified patent and that said Letters Patent is hereby corrected as shown below:

<u>COLUMN 18</u>

```
Line 4,  "claim 1" should read --claim 1,--.
Line 8,  "claim 1" should read --claim 1,--.
Line 12, "claims 1-3" should read --claims 1 to 3,--.
Line 17, "claims 1-3" should read --claims 1 to 3,--.
Line 22, "claim 4 or 5" should read --claim 4 or 5,--.
Line 23, "claim 1" should read --claim 1,--.
```

Signed and Sealed this

Nineteenth Day of October, 1993

BRUCE LEHMAN

*Attest:*

*Attesting Officer*     *Commissioner of Patents and Trademarks*